(12) United States Patent
Sieradzki et al.

(10) Patent No.: US 7,059,817 B2
(45) Date of Patent: Jun. 13, 2006

(54) WAFER HANDLING APPARATUS AND METHOD

(75) Inventors: Manny Sieradzki, Gloucester, MA (US); Nicholas R. White, Manchester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/307,022

(22) Filed: Nov. 27, 2002

(65) Prior Publication Data

US 2003/0123958 A1     Jul. 3, 2003

Related U.S. Application Data

(60) Provisional application No. 60/334,251, filed on Nov. 29, 2001.

(51) Int. Cl.
*B65G 49/07*     (2006.01)

(52) U.S. Cl. .................. 414/217; 414/805; 414/939

(58) Field of Classification Search ............ 414/217, 414/939, 805
See application file for complete search history.

(56) References Cited

U.S. PATENT DOCUMENTS

| | | | |
|---|---|---|---|
| 5,019,233 A * | 5/1991 | Blake et al. ........... 204/192.12 |
| 5,482,607 A * | 1/1996 | Hashimoto et al. .... 204/298.25 |
| 5,486,080 A | 1/1996 | Sieradzki .................. 414/217 |
| 5,695,564 A * | 12/1997 | Imahashi ................... 118/719 |
| 6,034,000 A | 3/2000 | Heyder et al. |
| 6,200,883 B1 | 3/2001 | Taylor et al. ............... 438/514 |
| 6,428,262 B1 * | 8/2002 | Vanderpot et al. .......... 414/217 |
| 6,450,750 B1 * | 9/2002 | Heyder et al. .............. 414/217 |
| 6,520,727 B1 * | 2/2003 | Babbs et al. ................ 414/217 |
| 6,525,327 B1 | 2/2003 | Mitchell et al. ........ 250/492.21 |
| 6,540,869 B1 * | 4/2003 | Saeki et al. ............ 156/345.31 |
| 6,555,825 B1 | 4/2003 | Mitchell et al. ............ 250/398 |
| 6,577,923 B1 * | 6/2003 | White et al. ................ 700/245 |
| 6,616,394 B1 * | 9/2003 | Park ...................... 414/222.01 |
| 6,646,276 B1 | 11/2003 | Mitchell et al. ........ 250/492.21 |
| 6,679,675 B1 | 1/2004 | Mitchell et al. .......... 414/744.3 |
| 6,690,986 B1 | 2/2004 | Mitchell et al. ............ 700/112 |
| 6,748,293 B1 * | 6/2004 | Larsen ....................... 700/218 |

FOREIGN PATENT DOCUMENTS

EP     1119022     *   7/2001

* cited by examiner

*Primary Examiner*—James W. Keenan
(74) *Attorney, Agent, or Firm*—Ralph A. Loren; Edwards Angell Palmer & Dodge LLP

(57) ABSTRACT

A high-speed wafer-processing apparatus and method that employs a vacuum chamber having at least two wafer transport robots and a process station. The vacuum chamber interfaces with a number of single-wafer load locks that are loaded and unloaded one wafer at a time by a robot in atmosphere. Four load locks are sized to allow for a gentle vacuum cycling of each wafer without significant pump-down delays. The robots in the vacuum chamber move wafers sequentially from one of the load locks to a process station for processing and then to another one of the load locks for unloading by the atmospheric robot.

31 Claims, 3 Drawing Sheets

|  | T0 | T1 | T2 | T3 | T4 | T5 | T6 | T7 | T8 |
|---|---|---|---|---|---|---|---|---|---|
| First Load Lock | At atmosphere loading wafer 10 | Rough down with wafer 10 | At vacuum awaiting unloading of wafer 10 | At vacuum unloading wafer 10 | At vacuum loading wafer 8 from process station | Venting with wafer 8 | At atmosphere unloading wafer 8 | At atmosphere loading wafer 14 | Rough down with wafer 14 |
| Second Load Lock | At vacuum loading wafer 6 from process station | Venting with wafer 6 | At atmosphere unloading wafer 6 | At atmosphere loading wafer 12 | Rough down with wafer 12 | At vacuum awaiting unloading of wafer 12 | At vacuum awaiting unloading of wafer 12 | At vacuum unloading wafer 12 | At vacuum loading wafer 10 |
| Third Load Lock | At vacuum awaiting unloading of wafer 9 | At vacuum unloading wafer 9 | At vacuum loading wafer 7 from process station | Venting wafer 7 | At atmosphere unloading wafer 7 | At atmosphere loading wafer 13 | Rough down with wafer 13 | At vacuum for unloading of wafer 13 | At vacuum for unloading of wafer 13 |
| Fourth Load Lock | Venting with wafer 5 | At atmosphere unloading wafer 5 | At atmosphere loading wafer 11 | Rough down with wafer 11 | At vacuum awaiting unloading of wafer 11 | At vacuum unloading wafer 11 | At vacuum loading wafer 9 from process station | Venting wafer 9 | At atmosphere unloading wafer 9 |
| First Vacuum Robot | Picking wafer 6 off process station and loading into second load lock | Remove wafer 8 from first holding station and idle for process station | Placing wafer 8 onto process station | Picking wafer 10 from first load lock and placing onto first holding station | Picking wafer 8 from process station and loading into first load lock | Picking wafer 10 from the first holding station and idling until completion of wafer 9 on process station | Loading wafer 10 onto process station | Picking wafer 12 from second load lock and loading onto first holding station | Picking wafer 10 from process station and loading into second load lock |
| Second Vacuum Robot | Loading wafer 7 onto process station | Picking wafer 9 from third load lock and loading onto second holding station | Picking wafer 7 from the process station and loading into third load lock | Unloading wafer 9 from second holding station and idles for completion of wafer 8 processing | Loading wafer 9 onto process station | Picking wafer 11 from fourth load lock and loading onto second holding station | Unloading wafer 9 from process station and loading into fourth load lock | Unloading wafer 11 from the second holding station and idles for completion of wafer 10 on process station | Picking wafer 11 from second holding station and placing onto process station |
| First Holding Station | Orienting wafer 8 | Idle unloading wafer 8 | Idle awaiting wafer 10 | Idle loading wafer 10 | Orienting wafer 10 | Idle unloading wafer 10 | Idle awaiting wafer 12 | Idle loading wafer 12 | Orienting wafer 12 |
| Second Holding Station | Idle awaiting wafer 9 | Idle loading wafer 9 | Orienting wafer 9 | Idle unloading wafer 9 | Idle awaiting wafer 11 | Idle loading wafer 11 | Orienting wafer 11 | Idle unloading wafer 11 | Idle awaiting wafer 13 |
| Processing Station | Idle unloading wafer 6 and loading wafer 7 | Processing wafer 7 | Idle unloading wafer 7 and loading wafer 8 | Processing wafer 8 | Idle unloading wafer 8 and loading wafer 9 | Processing wafer 9 | Idle unloading wafer 9 and loading wafer 10 | Processing wafer 10 | Idle unloading wafer 10 and loading wafer 11 |

FIGURE 3

WAFER HANDLING APPARATUS AND METHOD

RELATED APPLICATIONS

The current application claims priority from Provisional Patent Application Ser. No. 60/334,251 entitled WAFER HANDLING APPARATUS AND METHOD filed on Nov. 29, 2001.

BACKGROUND OF THE INVENTION

The present invention relates to a method for moving workpieces in a vacuum chamber to maximize throughput. More specifically, it involves methods that minimize the amount of time between wafer processing by utilizing a parallel flow of workpieces for processing in the vacuum chamber. Each workpiece undergoes the same steps of introduction to the vacuum chamber, alignment to a suitable orientation, processing, and removal from the vacuum chamber. Four wafers are at various phases of the wafer handling and processing cycle simultaneously, thus maximizing utilization of the equipment while minimizing cycle time.

Up to twenty different types of tools are employed for affecting several hundred processing steps during the processing of wafers in the manufacture of microelectronic circuits. Most of these processing steps must be performed in a vacuum chamber at pressures less than $1 \times 10^{-3}$ torr, and each requires from about ten seconds to three minutes per wafer. Most of the processing tools operate on wafers one at a time in order to optimize control and reproducibility in a manufacturing environment.

In general, each operation on a wafer must be performed in a particular order, so that each operation must wait until completion of a preceding one, and, in turn, affects the time a wafer is available for a subsequent step. Tool productivity or throughput for vacuum processes that are relatively short, such as ion implantation, can be severely limited if the work flow to the processing location or platen is interrupted by sequential events, which may include, for example, the introduction of the wafer into the vacuum system, the orientation of a wafer in the vacuum chamber or the exchange of wafer carriers or cassettes.

It is desirable to shorten the duration of sequential events, i.e., those events that must be performed consecutively in order to increase throughput. However, the pump down times (to high vacuum) and the venting times (to atmospheric pressure) must be relatively long to reduce turbulence and ensure the wafer remains free of particles and foreign materials that could be redistributed from the load lock surfaces to the wafer.

The prior art has sought to address these concerns in a number of ways. For example, U.S. Pat. No. 5,486,080 of Sieradzki, which is incorporated herein by reference, employs two wafer transport robots to move wafers from two load locks past a process station. Both robots alternately transport each wafer from the cassette at one of the load locks along a path to an orientation position, through the process station, and back to the cassette until all the wafers in the cassette are processed. Pumpdown or venting of the other (second) load lock with another cassette holding multiple wafers occurs while the wafers in the cassette at the first load lock are processed. After processing the wafers from the first load lock, the first load lock is closed and vented while the second load lock is opened and the robot then transport the wafers from the second load lock through the process station. This procedure adequately achieves high throughputs for a cassette loaded batch of wafers (200 mm wafers), but does not address the requirements resulting from the use of 300 mm wafers.

With the continuing trend toward smaller and faster electronic devices, the use of cassettes to hold and transport wafers is now burdensome. For example, 300 mm wafers are transported in Front-Opening Unified Pods (FOUPs), which keep the wafers in an ultra-clean environment. The FOUPs interface to dedicated modules on process equipment, which automatically open their doors while an atmospheric robot removes and replaces wafers as required. These FOUPs are not intended to be loaded into vacuum, whereas cassettes used to transport 200 mm wafers may be directly placed in load locks and brought to vacuum. As such, a system optimized for 300 mm wafers has different requirements from earlier systems.

SUMMARY OF THE INVENTION

The present invention addresses the above-described limitations of handling wafers in a vacuum environment. The present invention provides an approach whereby at least four load locks interfacing with a vacuum chamber cycle in a sequence between vacuum and atmosphere to reduce the cycle time for processing a wafer. The steps of the cycle can be carried out simultaneously on different wafers to optimize the amount of time the process station is utilized.

The present invention provides a method for processing wafers. Each of the wafers undergoes the same cycle:
- it is placed in a load lock,
- the load lock is roughed down to vacuum,
- the wafer is removed from the load lock and placed on a holding station (where orientation is performed if necessary),
- the wafer is transferred to the process station for processing (such as ion implantation),
- the processed wafer is removed from the process station and placed in another load lock (different from the load lock in which it was roughed down), and
- the load lock is vented to atmosphere where the wafer is removed and replaced with a new wafer.

While each wafer must undergo these steps in sequence, allowing all the steps to be finished for one wafer, then proceeding with the next wafer is time consuming; the process station can be better utilized. The present invention is based, in part, on the recognition that parallel cycling of wafers better utilizes the system resources. Because the time required for placing the wafer onto the process station, processing the wafer and removing the wafer from the process station takes about one-quarter of the vacuum cycle and atmospheric wafer exchange time, the inventors recognized that four wafers could be at various phases of the cycle simultaneously to maximize efficiency. This is desirable because more rapid venting and roughing of wafers to and from the vacuum system adds particles and other foreign materials to the surfaces of the wafer resulting in reduced production yields. Thus, optimizing cycling could be achieved by simultaneously having a wafer in each state of a load lock cycle. Further, the inventors realized that grouping load locks in pairs and having a wafer brought to vacuum in one load lock and then exiting through a second load lock of the pair would result in the optimum efficiency of the load locks. In addition, the highest process station productivity would result by having two pairs of load locks operating in parallel, each pair accessed by an independent robot acting in vacuum, with each robot able to access the process station. To accomplish this, at least two robots acting in vacuum, at least four load locks, and at least two holding stations are necessary to achieve optimal usage of one process station. If the time for the in vacuum part of the cycle could be shortened further, additional load locks could provide additional cycle time benefits.

The steps of the method are performed using a first pair of load locks ($LL_{11}$ and $LL_{12}$), a second pair of load locks ($LL_{21}$ and $LL_{22}$), and a vacuum chamber that includes a first vacuum robot ($VR_1$) associated with the first pair of load locks ($LL_{11}$ and $LL_{12}$) and a second vacuum robot ($VR_2$) associated with the second pair of load locks ($LL_{21}$, and $LL_{22}$). Each of the robots operates independently of each other for handling the wafers in vacuum. Each of the load locks includes a first portion opening to atmosphere and a second portion opening to the vacuum chamber.

Wafers are placed on and removed from the process station by first one vacuum robot and then the other. In steady-state operation the first wafer has completed processing. $VR_1$ removes the processed first wafer from the process station and the $VR_2$ places the second wafer on the process station.

A third wafer has previously been removed a $LL_{12}$ by $VR_1$ and placed on the first holding station.

$VR_1$ places the processed first wafer in $LL_{12}$ and $LL_{12}$ begins venting. Nearly simultaneously, a fourth wafer is introduced into vacuum through $LL_{22}$.

The fourth wafer is removed from $LL_{22}$ by $VR_2$ and placed on the second holding station. $VR_2$ then removes the processed second wafer from the process station followed by $VR_1$'s placement of the third wafer onto the process station.

$VR_2$ then places the processed second wafer into $LL_{22}$ and this load lock begins venting. Nearly simultaneously, a fifth wafer is introduced into vacuum through $LL_{11}$ of the first pair of load locks.

The fifth wafer is removed from $LL_{11}$ by $VR_1$ and placed on the first holding station. $VR_1$ then removes the processed third wafer from the process station followed by $VR_2$'s placement of the fourth wafer onto the process station.

$VR_1$ then places the processed third wafer into $LL_{11}$ and this load lock is vented.

In this way wafers are continuously processed. Each of the steps: bringing the wafer to vacuum, handling the wafer in vacuum for orientation, processing the wafer, and venting to atmosphere so a new wafer can be cycled, are carried out sequentially on four wafers roughly ninety degrees out of phase with one another. More explicitly, if we define $t_p$ as the time required to place a wafer on the process station, process the wafer, and remove the wafer from the process station, the time available for venting a load lock, exchanging the processed wafer with a new wafer, and pumping the load lock is approximately $3t_p$. If $t_p$ is equal to 15 seconds, a full 45 seconds is available to vent a load lock, exchange the processed wafer with a new wafer, and pump the load lock. This results in high throughputs while ensuring slow vent and pump down time to maintain wafer cleanliness.

In another aspect of the present invention, the method processes wafers using four load locks, a vacuum chamber that includes a first and second vacuum robot for handling the wafers in vacuum, a process station, and a first and second holding station for preprocessing the wafers. The first and second vacuum robots operate independently of each other and each of the load locks has a first portion opening to atmosphere and a second portion opening to vacuum in a vacuum chamber. The first vacuum robot interfaces with the first and second load locks, and the second vacuum robot interfaces with the third and fourth load locks.

To start a processing cycle, the first load lock that contains a first wafer is roughed down to vacuum. After the first load lock reaches vacuum, the second portion of the load lock opens to vacuum for the removal of the first wafer by the first vacuum robot. The first vacuum robot places the first wafer onto the first holding station for preprocessing, such as orientation. In turn, a second wafer, which has been roughed down in the second lock and which just completed processing, is removed from the process station and is loaded at vacuum into the first load lock by the first vacuum robot. The first load lock vents to atmosphere to end a processing cycle for the second wafer. Once at atmosphere, the second wafer is removed from the first load lock and a third wafer is placed in the first load lock that is roughed down to vacuum to start a processing cycle for the third wafer. At the same time, but offset in the cycle by one quarter of the cycle, the second vacuum robot is carrying out the same steps, accessing the third and fourth load locks (that form a second pair), and using a second holding station and the same process station. Again, the processed wafers enter vacuum in one of the load locks and exit vacuum in the other of the pair.

After preprocessing of the first wafer completes, it is removed from the first holding station using the first vacuum robot and held by the first vacuum robot until the second vacuum robot removes a wafer it placed on the process station for processing. After placing the first wafer of the process station, the first vacuum robot removes the third wafer from the second load lock at vacuum and places it onto the first holding station for preprocessing. Following completion of the processing of the first wafer, the first vacuum robot removes the first wafer from the process station and loads the second load lock, which is open at vacuum, with the first wafer for venting to atmosphere to end the processing cycle for the first wafer. Once the first wafer is removed from the process station, the process station again becomes available to the second vacuum robot that can place a wafer for processing on the process station. When the process station again becomes available to the first vacuum robot, the first vacuum robot removes the second wafer from the first holding station and places the second wafer onto the process station for processing. The above steps are carried out in a concurrent manner using the third and fourth load locks, the second vacuum robot, the second holding station, and the process station to concurrently process wafers. The process station alternately receives and processes wafers provided by the first vacuum robot and the second vacuum robot. Optionally, an atmospheric robot operates in atmosphere to load and unload each load lock with wafers from a carrier to maintain a substantially constant flow of wafers.

The present invention also provides a system for processing a workpiece in vacuum. The system includes a vacuum chamber maintained at high vacuum that contains a process station, a first and second holding station, and a first and second vacuum robot for transferring workpieces from the holding stations to the process station in the vacuum chamber. The first vacuum robot and the first holding station are associated so that they work in conjunction with each other while the second vacuum robot and the second holding station are associated and work in conjunction with each other. Each association is mutually exclusive of the other. Four load locks interface with the vacuum chamber. Each of the load locks is capable of receiving a workpiece at atmospheric pressure and introducing it to the vacuum chamber for processing. In like fashion, each of the load locks is capable of receiving a workpiece at vacuum from the vacuum chamber at completion of workpiece processing and returning the workpiece to atmospheric pressure. Each of the load locks cycle between atmosphere and vacuum always with a wafer in it, under computer control in a sequence that results in a ninety degree phase offset in the cycle amongst the load locks. The load locks are grouped in pairs so that a first pair is associated with the first vacuum robot and first holding station, and the second pair is associated with the second vacuum robot and second holding station. Additionally, the system can include a docking station in atmosphere to receive and hold a FOUP. An atmospheric robot operating in atmospheric pressure can be used to transport wafers between the FOUPs and each of the load locks.

BRIEF DESCRIPTION OF THE DRAWINGS

FIG. 3 illustrates an exemplary timing diagram in an illustrative embodiment of the present invention.

DETAILED DESCRIPTION

Before beginning with the detailed description, it is helpful to first define a few terms as used throughout the specification and claims.

As used herein, the term "robot" refers to an articulated arm under independent control.

As used herein, the terms "parking station", "transfer station", "orientation station", or "holding station" refers to a device that holds a wafer before processing, and can orient or align a wafer.

Figure 1:
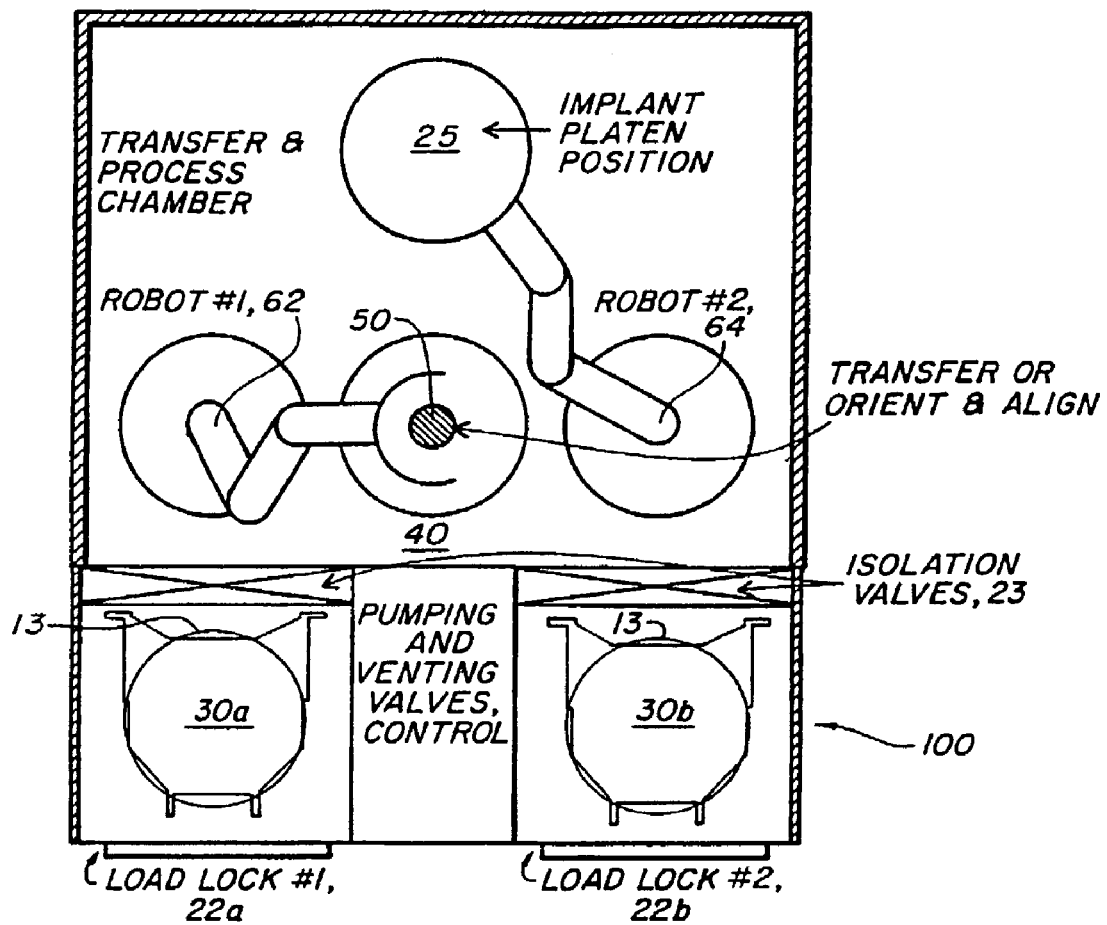
FIG. 1 illustrates the prior art system described in U.S. Pat. No. 5,486,080.

FIG. 1 shows a prior art wafer handling system. The prior art system employs two cassettes holding a plurality of wafers and two load locks. A cassette of wafers is loaded into one of the load locks. While one load lock is being vented, the cassette exchanged, and the load lock pumped down, the other load lock remains in a vacuum state and all the wafers from its cassette are processed in sequence. That is, a load lock is cycled to vacuum and back to atmosphere once for each cassette of wafers placed in the load lock.

In the prior art system illustrated in FIG. 1, processing of wafers occurs by transferring the wafers between robots via a transfer station. That is, robot #1 removes a wafer from a cassette in the load lock #1 and transfers the wafer to the transfer station 50. Robot #2 removes the wafer from the transfer station 50 and places the wafer on the platen 25 for processing at the process station. After the wafer is processed, robot #1 removes the wafer from the platen 25 and returns this wafer to the cassette in load lock #1. This cycle is followed until all the wafers in the cassette are processed.

This system works well for 200 mm wafers that are transported in cassettes where the cassettes maybe introduced into the vacuum system. Since FOUP's cannot be placed into a vacuum system this system requires wafers to be transferred from a FOUP into a wafer holding device in the load lock. To compensate for the additional handling step, the prior art system must employ complex rapid atmospheric wafer handling that places wafers at increased risk of damage.

Figure 2:
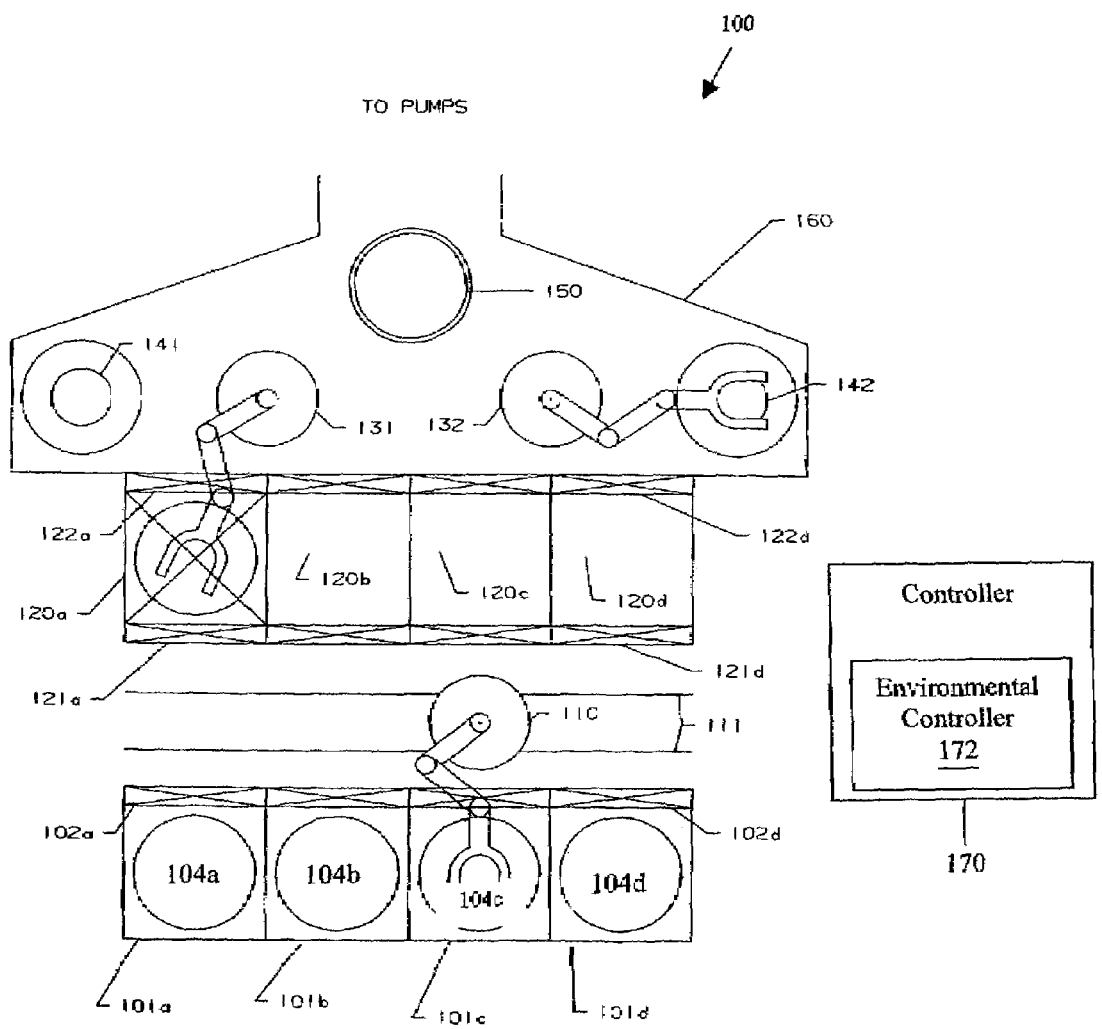
FIG. 2 illustrates an exemplary wafer handling system in accordance with an illustrative embodiment of the present invention.

FIG. 2 illustrates a system 100 suitable for practicing the present invention. Nevertheless, those skilled in the art will understand that this is a diagrammatic representation of a three-dimensional form and that various forms and details can be implemented without departing from the scope of the present invention. The system 100 includes one or more docking stations 101a through 101d to receive one or more FOUPs 104a through 104d. Each of the docking stations 101a through 101d includes a door 102a through 102d that can be opened automatically by commercially available equipment, not shown. A robot 110 operating in atmosphere is capable of moving along a track 111 to load and unload wafers from each of the docking stations 101a through 101d. The robot 110 is capable of additional degrees of freedom including vertical, radial and azimuthal movements. Operation of the robot 110 in relation to the docking stations 101a through 101d is discussed below in more detail. Although the system 100 is discussed in connection with the use of FOUPs, one skilled in the art will recognize that in certain applications cassettes may be used in place of FOUPs as a transportation carrier for transport of the wafers or workpieces at atmosphere.

A vacuum chamber 160 is provided with four load locks 120a through 120d, each of which is provided with an atmospheric valve 121a through 121d, which opens to allow transfer of a wafer in atmosphere from one of the docking stations 101a through 101d to a selected load lock. Each of the load locks 120a through 120d include a vacuum valve 122a through 122d, which opens to allow transfer of the wafer from the load lock into the vacuum chamber 160. Load locks 120a through 120d are further equipped with venting and pumping means and with other valves and controls (not shown) that one skilled in the art will recognize. The load locks 120a through 120d are shown as being located side-by-side but can optionally be disposed as two pairs one above the other.

Within the vacuum chamber 160 is a process station 150 addressable by a robot 131 and a robot 132. Robot 131 can address a holding station 141, which can pre-orient a wafer for processing at process station 150. Robot 132 can address a holding station 142 that is similar to the holding station 141. A controller 170 is provided to control sequencing of wafers through the system 100 and to control activation, deactivation and overall coordination of mechanical and environmental operations during wafer handling and processing. The environmental operations include, for example, control of vent and pump down operations for each of the load locks 120a through 120d and control of the clean environment in the vacuum chamber 160. The mechanical operations include, for example, instructing of each robot or wafer handler and control of certain valves and other mechanical devices. The controller 170 can optionally include an environmental controller 172 to control all or part of the environmental operations.

A variety of vacuum processes benefit from the present invention. One such vacuum process is ion implantation. With ion implantation, the implantation process time per wafer is often less than about 10 seconds. As such, with the use of an illustrative embodiment of the present invention, wafer throughputs of greater than 300 wafers per hour may be achievable for an ion implantation process.

In practice, one wafer is removed from a slot in a selected FOUP or cassette in one of the docking stations 101a through 101d by the robot 110, and placed into one of the load locks 120a through 120d, which is pumped down to vacuum, and opened to the vacuum chamber 160. The wafer is transported to one of the holding stations 141, 142 by one of the robots 131 and 132 depending upon which load lock the wafer is placed. Which robot and holding station is selected to handle the wafer depends on which load lock the wafer is loaded into at atmosphere. For example, if the wafer is loaded into load lock 120a or 120b at atmosphere, robot 131 and holding station 141 are employed to process the wafer through the vacuum chamber 160. In similar fashion, if the wafer is loaded into load lock 120c or 120d at atmosphere, robot 132 and holding station 142 are employed to process the wafer through the vacuum chamber 160. If the application is ion implantation, the holding stations may be alignment stations for alignment and pre-orientation of wafers. To place an unprocessed wafer onto the process station 150 with a minimum amount of delay, it is desirable to employ a sequence of robotic movement that instructs the robot 131 remove a processed wafer from the process station 150 and instructs the robot 132 place an unprocessed wafer from the holding station 142 onto the process station 150 as soon as the processed wafer is removed by the robot 131. In this manner, a wafer enters the system 100 for processing about every ten to fifteen seconds.

Furthermore, all other wafer handling, atmospheric and vacuum, such as, alignment and orientation is performed as a background operation in parallel to the processing of a wafer on the process station 150. After processing, the processed wafer is placed directly into one of the load locks 120a through 120d, which is vented and opened to atmosphere to allow removal of the processed wafer.

System 100 advantageously provides single-wafer vacuum entry and exit, and single-wafer processing. That is, one wafer rather than a batch of wafers is at risk at one time, thus providing greater flexibility in the selection and control of process variables such as beam incident angle, and cycle times at the various steps in the process. Further, system throughput does not depend on lot size as is the case when wafers are introduced into the vacuum system in batches of twenty-five. Furthermore, single wafer processing allows for the internal dimensions of each load lock to be minimized so that the internal volume of each load lock is significantly less than a load lock constructed to receive more than one wafer. The result of minimizing the internal volume of each load lock is shorter cycle times for pumping down and venting of each load lock due to the smaller volume to evacuate. This improvement in pump down and vent cycle times of the load locks by the system 100 is realized without increasing the risk of wafer contamination, because fast vacuum cycling of each load lock is not required. Moreover, single wafer processing is extremely suitable for process development work where small lot sizes and fast turnaround is more economical. Consequently, system 100 is able to provide significant advantages without compromising the throughput or particle contamination performance of the system.

The nature or configuration of the process station 150 is dependent in part upon the vacuum process being employed. For example, in an ion implantation implementation, the process station 150 can include an electrostatic chuck or platen that clamps the wafers using only backside contact. To aid in transferring wafers, the process station 150 optionally includes three lift pins that are actuated by a mechanism below the surface of a platen. In operation, a wafer is extended over the electrostatic chuck by one of the robots 131, 132 and the lift pins are raised. The selected robot is retracted and the pins are lowered. When the electrostatic chuck senses the presence of the wafer, the chuck applies a clamping voltage to ensure secure clamping. Having secured the wafer, the electrostatic chuck is tilted as appropriate and moved so as to traverse the wafer through a ribbon-shaped or scanned ion beam to accomplish uniform ion implantation. After implantation, the chuck returns to the start position, unclamps the wafer, the pins are raised, and the robot that loaded the platen with the wafer unloads the wafer from the process station. With the robot under the wafer, the pins are lowered to transfer the wafer onto an arm of one of the robot.

In accordance with a goal of achieving high wafer throughput, for example greater than 250 wafers per hour, without excessively rapid pumping, venting, or fast robotic motions in vacuum, the following exemplary process flow illustrates the hardware and process steps to achieve this end. Consider the case of a system capable of processing 240 wafers per hour. The total cycle time per wafer through the system 100 is about sixty seconds. Those skilled in the art will recognize that this cycle time is merely illustrative and may be shortened resulting in yet higher throughput, but the use of sixty seconds facilitates the discussion below.

It is undesirable for any other steps to intrude on this timing, or the process time is curtailed possibly resulting in a limited throughput of the system. Other time periods that need to be as long as possible are the periods for venting and pump down of each of the load locks 120a through 120d. A time between ten and twenty seconds is desirable for each of these operations, to minimize particulate contamination of a wafer. Furthermore, when each of the load locks 120a through 120d is opened to atmosphere, the robot 110 in atmosphere collects a wafer, returns it to its slot and collects another wafer from a different location, sometimes in a different cassette or FOUP, and places the just collected wafer in the recently vacated load lock, requiring a time of between six and fourteen seconds. Accordingly, to maximize efficiency, it is desirable to use four or more load locks.

Indeed, clean pumping and venting is facilitated by minimizing the load lock volume, so the use of single-wafer load locks is desirable. Using an estimated time budget of about forty seconds for each of the load locks 120a through 120d to complete the pumping and venting cycle, the vent time and the pumpdown time for each of the load locks 120a through 120d is about sixteen seconds for each operation, and the atmospheric load and unload time by the robot 110 is about ten seconds.

The time periods of the pump down and vent operations can be reduced to increase throughput, but at the expense of less clean processing. Clean processing requires minimum disturbance of any particulate contamination in each of the load locks 120a through 120d and avoidance of the creation of condensation by too rapid quasi-adiabatic expansion of moist air in each of the load locks 120a through 120d during pump down. As such, it becomes clear that each of the load locks 120a through 120d should be as small as reasonably possible, and for a 300 mm wafer, with a 1 cm clearance on all sides, the volume of each of the load locks 120a through 120d is estimated to be about two liters.

It is a further advantage of the system 100 that each of the load locks 120a through 120d can be opened after the end of every process step, several seconds before the next processing step begins. This tends to make the pressure in the system identical during every process step, removing a source of systematic process variation that occurs in other process flows.

In one exemplary embodiment of the system 100, the load locks 120a through 120d are physically arranged in two stacks of two load locks. The robot 110 moving on the track 111 in atmosphere can address both stacks and all FOUPs 104a through 104d, or cassettes. The robot 110 can include a vacuum chuck, and is capable of relatively high speed movement. Each of the robots 131 and 132 operate independently of each other in vacuum. The robot 131 accesses a first pair of load locks, one of the handling stations 141, 142, and the process station 150. The robot 132 accesses a second pair of load locks, the other of the handling stations 141, 142, and the process station 150. Those skilled in the art will recognize that is possible to arrange and stack more than two pair of load locks. Moreover, because the robot 110 in atmosphere can use a vacuum chuck to securely hold the wafers by the backside, it is permitted to use high accelerations and fast motions. Thus a single robot may be sufficient to meet throughput requirements, but more than one robot 110 can be used if desired.

FIG. 2 is referred to below to discuss an exemplary set of wafer transport paths. To facilitate the discussion below the exemplary set of wafer transport paths focuses on the FOUP 104a holding one or more wafers located at the docking station 101a, the load locks 120a and 120b, the first vacuum robot 131, and the holding station 141. In practice, a FOUP may hold up to twenty-five wafers in a vertical array and as such, the exemplary set of wafer transport paths are repeated twenty-five times until all wafers in the FOUP have completed processing. Nonetheless, those skilled in the art will recognize that the details discussed below apply equally to an exemplary set of wafer transport paths for the FOUPs 104b through 104d loaded into the docking stations 101b through 101d. FIG. 3 discussed below further illustrates the exemplary set of wafer transport paths as applied to the load locks 120a through 120d. For the ease of the discussion below, the exemplary wafer transport paths employ the operation of load locks 120a, 120b, first vacuum robot 131, and first handling station 141. Nevertheless, those skilled in the art will recognize that the discussion of the exemplary set of wafer transport paths are equally applicable to the operation of load locks 120c and 120d, the second vacuum robot 132, and the handling station 142, because each grouping of wafer handling devices operate in a concurrent manner.

Moreover, while the wafers from the FOUP 104a in the docking station 101a are processed, other FOUPs can be inserted or removed from each of the docking stations 101b through 101d, to maintain a continuous or near continuous supply of unprocessed wafers. Such operations can occur with flexible scheduling in background to the sequence of operations described below. Each new load of wafers will in due course be processed by a similar sequence of steps to that described below. After the last wafer from one location has been removed, the next load of wafers can be removed from a selected one of the docking stations 101b, 101c, or 101d, in a similar sequence. For convenience in tracking wafers, each wafer removed can be returned to the slot in the cassette or FOUP from which it was removed.

FIG. 3 illustrates an exemplary timing diagram for the system 100 that illustrates the parallel processing of wafers so that each subsequent wafer lags an immediately preceding wafer by about ninety degrees in cycle phase through the process. As such, the load locks 120a through 120d operate in a sequential manner so that at a given point in time one load lock is open to vacuum, one load lock is open to atmosphere, one load lock is venting, and one load lock is pumping down. That is, about every twelve to fifteen seconds, the next load lock in the sequence carries out the same step as its predecessor. The time for each of these steps is not required to be equal, but each load lock goes through this same sequence repetitively, recommencing the full cycle at equally phased intervals. Thus, it follows that every operation in the sequence is repeated about every twelve to fifteen seconds later.

The actions of the robots 131, 132, the holding stations 141, 142 and the load locks 120a through 120d alternate between right and left, where load locks 120a and 120b, robot 131, and holding station 141 are classified as left in the system 100, and load locks 120c and 120d, robot 132, and holding station 142 are classified as right in the system 100. Furthermore, a wafer introduced into a first load lock on the left side of the system 100 is removed after processing from a second load lock on the left side of the system 100. That is, a wafer loaded into the load lock 120a at atmosphere for processing is unloaded from the load lock 120b at atmosphere when the processing is complete.

The same holds true for the right side of the system 100. For example, an unprocessed wafer loaded into load lock 120c at atmosphere and subsequently processed, is unloaded from load lock 120d at atmosphere at the completion of the processing. In this manner, it is possible to have a load lock on each respective side of the system 100 open to the vacuum chamber awaiting exchange of a wafer. This ensures that the load locks are always pumped down or vented with a wafer. Moreover, this allows each load lock to realize a time of about thirty seconds per wafer to vent, exchange a processed wafer for an unprocessed wafer and pump down to high vacuum. This allotted cycle time of about fifty to sixty seconds helps to maintain the requisite level of cleanliness in each load lock to prevent particulate contamination of a wafer during pump down and venting. The fifty second cycle time allots about fifteen seconds for venting, ten seconds for wafer exchange at atmosphere, and about fifteen for pump down with the remaining time used for system pressure equalization.

As such, those skilled in the art should recognize and understand the process flow and timing for multiple wafers based on the description of the process flow and timing discussed in connection with FIGS. 2 and 3. To illustrate the concurrent and parallel operations of the system 100, the discussion begins at a point in the process after a number of wafers from the FOUP 104a or cassette holding a lot of wafers have completed processing (i.e., steady state). It is understood that at initiation and termination of a lot of wafers by the system 100 certain operations or components may be idle or become idle. The path of each sequential wafer in the lot can be determined by adding an appropriate multiple of about fifteen seconds, and applying the below rules, because each preceding wafer in the lot follows a similar sequence. In the following discussion the origin of the timing is taken as the moment the load lock valve 121a for the load lock 120a begins to close.

The robot 110 collects a wafer from a slot in the FOUP 104a in the docking station 101a and introduces it into the load lock 120a. At about time zero (0) seconds, the atmospheric valve 121a closes, and the load lock 120a is roughed down to a pressure of around 1 Pa. At about time twelve (12) seconds, the vacuum valve 122a opens to a high vacuum (for example $1 \times 10^{-3}$ Pa), causing a brief rise in pressure in the vacuum chamber 160 lasting about one to four seconds. It will be seen that the timing of this event is often considered important. At about time sixteen (16) seconds the robot 131 begins to fetch the wafer from the load lock 120a, and at about time twenty-two (22) seconds the robot 131 places the wafer on the holding station 141. The holding station 141 determines the correct orientation of the wafer.

While the holding station 141 determines the correct orientation of the wafer, at about time twenty-three (23) seconds, the robot 131 begins to remove an already processed wafer from the process station 150, where its processing just completed. The processed wafer is placed in the load lock 120*a* by the robot 131 since it was loaded as an unprocessed wafer from load lock 120*b*. At about time twenty-four (24) seconds, the vacuum valve 122*d* opens. Those skilled in the art will recognize that because of the above timing any pressure burst in the vacuum chamber 160 occurs after the processing of a wafer has completed, and before the processing of the next wafer commences. Further, at about time twenty-four (24) seconds, the robot 132 commences placing another wafer onto the process station 150 from the holding station 142.

The robot 131 removes the first wafer from the holding station 141 at about time twenty-five (25) seconds, and is ready to place that wafer onto the process station 150. At about time thirty-one (31) seconds, the robot 132 begins to remove the processed wafer from the process station 150. At about time thirty-two (32) seconds, the vacuum valve 122*b* opens to introduce a new wafer to the vacuum chamber 160, causing a pressure burst in the vacuum chamber 160. With a minimum of delay, the robot 131 commences to move the first wafer from holding station 141 onto the process station 150, following the removal of the processed wafer from the process station 150 by the robot 132. Robot 131, after placing the first wafer onto the process station 150, removes the new wafer from the load lock 120*b* and places the new wafer onto the holding station 141 for orientation. At about time thirty-three (33) seconds, processing of the first wafer commences, and stops at about time thirty-eight (38) seconds. At about time forty (40) seconds, the robot 131 commences removal of the now processed first wafer from the process station 150. At about time forty-one (41) seconds the robot 131 places the first wafer into load lock 120*b* and the vacuum valve 122*b* closes at about time forty-two (42) seconds. Venting of the load lock 120*b* occurs from about time forty-two (42) seconds through about time fifty-four (54) seconds. The atmospheric valve 121*b* opens as soon as the pressure equalizes in the load lock 120*b*. The robot 110 in atmosphere picks the initially processed wafer out of the load lock 120*b* and returns that wafer to the slot in the FOUP 104*a* from which it came, completing the operation at about time fifty-seven (57) seconds.

FIG. 3 illustrates an exemplary timing diagram for the present invention, beginning at a point in time T0 after a number of wafers from a lot of wafers have cycled through system 100 for wafer processing (i.e., steady state). As such, at time T0, first load lock 120*a* is at atmosphere for the loading of a wafer 10, second load lock 120*b* is at vacuum loading a wafer 6 (which entered the system from load lock 120*a*) from process station 150, third load lock 120*c* is roughing down with wafer 9 for processing, fourth load lock 120*d* is venting with a wafer 5 (which entered the system from load lock 120*c*) that has completed processing. As such, robot 131 picks wafer 6 from process station 150 and loads it into load lock 120*b* for return to atmosphere. Robot 132 picks a wafer 7 off of holding station 142 and places wafer 7 onto process station 150 for processing once robot 131 removes wafer 6 therefrom. Wafer 7 was brought to vacuum in load lock 120*d*. While the load locks and robots perform their respective operations, holding station 141 orients a wafer 8 previously loaded by robot 131 from load lock 120*b* and holding station 142 is idle waiting for wafer 9 to reach vacuum. The process station 150 is idle for the unloading of wafer 6 and the loading of wafer 7. All even numbered wafers come from load locks 120*a* and 120*b*, while odd numbered wafers come from load locks 120*c* and 120*d*.

Subsequently, at time T1, the following operations occur in system 100. Load lock 120*a* begins roughing down with the wafer 10, load lock 120*b* vents with wafer 6, load lock 120*c* opens at vacuum for the removal of wafer 9, and load lock 120*d* opens at atmosphere for unloading of wafer 5. In parallel to the operations of the load locks, robot 131 removes wafer 8 from transfer station 141 and idles waiting to place it onto process station 150, and robot 132 picks wafer 9 from load lock 120*c*, and loads it onto holding station 142. Holding station 141 idles while wafer 8 is removed, and holding station 142 idles to receive wafer 9. Process station 150 processes wafer 7.

Thereafter, at time T2, the following operations are carried out in the system 100. Load lock 120*a* opens at vacuum for the removal of wafer 10, load lock 120*b* opens at atmosphere for removal of wafer 6, load lock 120*c* is open at vacuum awaiting the loading of wafer 7 from process station 150, and load lock 120*d* is open at atmosphere for the loading of wafer 11. At T2, robot 131 places wafer 8 onto process station 150. Before robot 131 places wafer 8 onto process station 150, robot 132 removes wafer 7 from process station 150 and loads wafer 7 into load lock 120*c* for return to atmosphere. Holding station 141 remains idle awaiting the next wafer and holding station 142 orients wafer 9. Process station 150 idles to remove wafer 7 and receive wafer 8.

Further, at time T3, the following operations are carried out in system 100. First load lock 120*a* is open to vacuum and robot 131 is unloading wafer 10, load lock 120*b* is open to atmosphere for the loading of a wafer 12. Load lock 120*c* is venting with wafer 7, and load lock 120*d* is roughing down with wafer 11. As the load locks are operating, robot 131 picks wafer 10 from load lock 120*a* and places it onto holding station 141, while robot 132 removes wafer 9 from holding station 142, and idles waiting for the processing of wafer 8 to complete. Holding station 141 idles to receive wafer 10 from robot 131 and holding station 142 idles for the removal just oriented wafer 9. Process station 150 processes wafer 8.

At time T4, system 100 carries out the following operations. First load lock 120*a* receives wafer 8 at vacuum from process station 150 via robot 131, second load lock 120*b* roughs down with wafer 12, load lock 120*c* opens at atmosphere for the unloading of wafer 7, and fourth load lock 120*d* opens at vacuum for the unloading of wafer 11. Robot 131 picks wafer 8 from process station 150, and loads first load lock 120*a* with wafer 8. Robot 132 places wafer 9 onto process station 150 for processing. While robots 131 and 132 handle wafers, holding station 141 orients wafer 10 and handling station 142 idles for the removal of wafer 9. Process station 150 idles for the unloading of wafer 8 by robot 131 and the loading of wafer 9 by robot 132.

At time T5, the following operations are carried out in system 100. Load lock 120*a* vents with wafer 8, load lock 120*b* opens at vacuum for the removal of wafer 12, load lock 120*c* is open at atmosphere for the loading of wafer 13, and load lock 120*d* is open at vacuum unloading wafer 11. At time T5, robot 131 unloads the wafer 10 from holding station 141 and waits for process station 150 to process wafer 9. Robot 132 picks wafer 11 from load lock 120*d* and places it onto holding station 142 for orientation. Holding station 141 idles for the removal of wafer 10 and holding station 142 idles to receive wafer 11. Process station 150 processes wafer 9.

Further, at time T6, first load lock 120*a* opens at atmosphere for unloading for wafer 8, load lock 120*b* remains open at vacuum awaiting the unloading of wafer 12, load lock 120*c* is roughing down with wafer 13, and load lock 120*d* is open at vacuum for the loading of wafer 9 from process station 150. Correspondingly, second robot 132 picks wafer 9 from process station 150, and loads it into load lock 120d. Robot 131 loads wafer 10 onto process station 150 after robot 132 removes wafer 9 therefrom. Holding station 141 idles awaiting the loading of wafer 12 and holding station 142 orients wafer 11. Process station 150 idles for the removal of wafer 9 and the placement of wafer 10.

Subsequently, at time T7, system 100 carries out the following steps. Load lock 120a is open at atmosphere for the loading of wafer 14, load lock 120b is at vacuum unloading wafer 12, load lock 120c opens at vacuum with wafer 13, and load lock 120d vents with wafer 9. Robot 131 picks wafer 12 from load lock 120b and loads it onto holding station 141. Robot 132 unloads wafer 11 from holding station 142, and idles awaiting the completion of processing of wafer 10 on process station 150. Holding station 141 idles to receive wafer 12 and holding station 142 idles for the removal of wafer 11. Process station 150 processes wafer 10.

System 100, at time T8, carries out the following steps. Load lock 120a, containing wafer 14, roughs down. Load lock 120b is open at vacuum for the loading of wafer 10 from process station 150, load lock 120c is open at vacuum for the removal of wafer 13, and load lock 120d opens at atmosphere for the unloading of wafer 9. Robot 131 picks wafer 10 from process station 150 and loads it into load lock 120b for venting to atmosphere. Robot 132 loads wafer 11 onto process station 150 once wafer 10 is removed therefrom. Holding station 141 orients wafer 12 while holding station 142 idles awaiting the loading of wafer 13 from load lock 120c. Process station 150 idles for the removal of wafer 10 and the placement of wafer 11.

System 100 continues in the above-detailed sequence of steps or operations until each wafer in the lot of wafers loaded into a selected docking station has been processed by and through the system. Nevertheless, those skilled in the art will recognize that system 100 can perform the above-described steps and operations in a continuous or near-continuous manner so long as an adequate supply of wafers for processing is provided to the system. That is, a number of docking stations, such as four, can be associated with the system to hold subsequent lots of unprocessed wafers for processing by the system. Moreover, the above discussion details that advantageous pairing of load locks to provide a load lock that is empty and open at vacuum awaiting the receipt of a processed wafer. The ability to provide a load lock open at vacuum waiting to receive a processed wafer as soon as processing is complete allows system 100 to realize a beneficial reduction in wafer processing cycle time.

While the present invention has been described with reference to an illustrative embodiment thereof, one skilled in the art will appreciate that various changes in form and detail may be made without parting from the intended scope of the present invention as defined in the pending claims. For example, robots 131 and 132 might be placed one above the other, or even integrated onto a common center to act as a robot with two concentric independent articulating arms. Further, load locks 120a through 120d need not be disposed in a straight line, but could be stacked two upon two. Furthermore, holding stations 141 and 142 need not be as shown, but could be located in any suitable position, including integrating them within each of robots 131 and 132.

The invention claimed is:

1. A method for processing wafers, the method comprising the steps of:
providing a first pair of load locks and a second pair of load locks, each of the load locks having a first portion opening to atmosphere and a second portion opening to vacuum in a vacuum chamber, said vacuum chamber including a first vacuum robot and a second vacuum robot for handling the wafers in vacuum;
controlling the first and second pairs of load locks in a desired sequence to cycle the wafers from atmosphere to vacuum and back to atmosphere;
having the first vacuum robot in the vacuum chamber remove a first wafer from a first load lock of the first pair of load locks, transport said first wafer to a process station for wafer processing in the vacuum chamber and loading the first wafer into a second load lock of the first pair when processing of the first wafer is complete; and
having the second vacuum robot in the vacuum chamber remove a second wafer from a first load lock of the second pair of load locks, transport said second wafer to a process station for wafer processing in the vacuum chamber and loading the second of the wafers into a second load lock of the second pair of load locks when processing of the second wafer in the vacuum chamber is complete, wherein said first and second vacuum robots are controlled to reduce the time between processing of successive wafers.

2. The method of claim 1, further comprising the step of having a first atmospheric robot in atmosphere load and unload each of the wafers from the first and second pair of load locks and transporting each of the wafers between the first and second load locks and a docking station in atmosphere.

3. The method of claim 2, further comprising the step of having the first atmospheric robot to distribute the wafers from the docking station in atmosphere among the first and second load locks forming the first pair of load locks and the first and second load locks forming the second pair of load locks in a substantially equal manner to provide a substantially continuous flow of wafers through the vacuum chamber.

4. The method of claim 2, wherein the step of having the first vacuum robot remove a first wafer comprises the steps of:
placing the first wafer on a first holding station after removing the first wafer from the first of the load locks forming the first pair of load locks; removing a third wafer from the process station located in the vacuum chamber; and loading the third wafer into the first load lock of the first pair of load locks.

5. The method of claim 4, wherein the step of having the first vacuum robot remove a first wafer further comprises the steps of:
removing the first wafer from the first holding station; and
loading the first wafer onto the process station for said processing.

6. The method of claim 5, wherein the steps of having the first vacuum robot and second vacuum robots remove wafers comprises the steps of:
instructing the first vacuum robot to remove the first wafer from the first load lock of the first pair of load locks and place the first wafer onto the first holding station in the vacuum chamber;
instructing the first vacuum robot to remove a third wafer from the process station in the vacuum chamber and place the third wafer into the first load lock of the first pair of load locks;
instructing the second vacuum robot to remove a second wafer from a second holding station in the vacuum chamber and place the second wafer onto the process station in the vacuum chamber for said processing; and at completion of processing of the second wafer on the process station, instructing the second vacuum robot to remove the second wafer from the process station in the vacuum chamber and load the second wafer into the second load lock of the second pair of load locks, and instructing the first vacuum robot to remove the first wafer from the first holding station and place it onto the process station in the vacuum chamber for processing.

7. The method of claim 6, wherein at least one of the holding stations comprises a wafer orientation device capable of orienting wafers to a desired orientation.

8. The method of claim 6, wherein at least one of the holding stations comprises a wafer aligner capable of aligning wafers to a desired alignment.

9. The method of claim 2, wherein said docking station is adapted to hold a carrier for said wafers comprising a front opening unified pod (FOUP).

10. The method of claim 1, wherein the step of controlling the first pair of load locks comprises the steps of:

closing an atmospheric valve associated with the first load lock of the first pair of load locks to pump out the atmosphere in the first load lock; and opening a vacuum valve associated with the first load lock of the first pair of load locks to bring the first load lock to vacuum.

11. The method of claim 1, wherein each of the load locks is capable of holding only one wafer.

12. A method for processing wafers, the method comprising the steps of:

providing a first pair of load locks, and a second pair of load locks, each of said load locks having a first portion opening to atmosphere and a second portion opening to vacuum in a vacuum chamber, said vacuum chamber including a first vacuum robot and a second vacuum robot for handling the wafers in vacuum, said first and second vacuum robots operating independently, and whereby a first wafer in said one of the load locks in said first load lock is subjected to the following steps:

removing said first wafer from a first load lock of said first pair of load locks with said first vacuum robot while said load lock is open to vacuum;

using said first vacuum robot to place said first wafer at a first holding station for orienting said first wafer for processing;

using said first vacuum robot to remove said first wafer from said first holding station and placing said first wafer at a process station where said first wafer is processed;

using said first vacuum robot to remove said processed first wafer from said process station and placing said first wafer into said second load lock of said first pair of load locks while said second load lock is open to vacuum;

venting said second load lock containing said first wafer to atmosphere;

opening said second load lock and removing said first wafer in atmosphere;

placing a third wafer in said second load lock in atmosphere;

reducing the pressure in said second load lock to match the pressure in said vacuum chamber so that said second load lock can be opened to vacuum; and removing said third wafer from said second load lock, starting the processing cycle for said third wafer;

and whereby said second vacuum robot carries out the same steps as the first vacuum robot with a second wafer except that said second wafer is initially in said one of the second pair of load locks, said second vacuum robot places said second wafer on a second holding station, and after processing, said second wafer is placed by said second vacuum robot in the other of said second pair of load locks rather than the load lock from which it originally entered the vacuum chamber.

13. The method of claim 12, further comprising the steps of, unloading the first wafer from a front opening unified pod (FOUP) mounted in a docking station in atmosphere; and loading the first wafer into said first load lock while said load lock is open at atmosphere.

14. The method of claim 13, further comprising the steps of, pumping down said first load lock with the first wafer therein to bring the first wafer to vacuum; and opening the second portion of said first load lock for processing of the first wafer, wherein the steps of pumping down and opening the second portion occurs in a cyclical order across each of the load locks.

15. A method for processing wafers, the method comprising the steps of a) providing first, second, third and fourth load locks, each of said load locks having a first portion opening to atmosphere and a second portion opening to vacuum in a vacuum chamber, said vacuum chamber including first and second vacuum robots for handling the wafers in vacuum, a process station, and a first and second transfer station for preprocessing the wafers, said first and second vacuum robots operating independently, and the first vacuum robot handling wafers from the first and second load locks and the second vacuum robot handling wafers from the third and fourth load locks;

b) roughing down the first load lock with a first wafer therein to start a processing cycle for the first of the wafers;

c) removing said first wafer from the first load lock at vacuum using the first vacuum robot and placing said first wafer onto said first transfer station for preprocessing;

d) loading the first load lock with a second wafer from the process station using the first vacuum robot and venting the first load lock to atmosphere to end a processing cycle for the second wafer;

e) roughing down the second load lock with a third wafer therein to start a processing cycle for the third wafer;

f) removing the first wafer from the first transfer station using the first vacuum robot and placing the first wafer onto the process station for processing;

g) removing the third wafer from the second load lock at vacuum using the first vacuum robot and placing the third wafer onto said first transfer station for preprocessing;

h) removing the first wafer from the process station using the first vacuum robot and loading the second load lock open at vacuum with the first wafer for venting to atmosphere to end the processing cycle for the first wafer;

i) removing the second wafer from the first transfer station using the first vacuum robot and placing the second wafer onto the process station for processing; and j) carrying out steps b through i using the third and fourth load locks, the second vacuum robot, the second transfer station, and the process station to concurrently process the wafers, said process station alternately processing wafers provided from the first vacuum robot and the second vacuum robot.

16. The method of claim 15, further comprising the step of, loading each of the load locks at atmosphere with the wafers using an atmospheric robot.

17. The method of claim 16, further comprising the step of, instructing the atmospheric robot to distribute the wafers from a selected docking station amongst the four load locks in a substantially equal manner to provide a substantially continuous flow of wafers to the vacuum chamber.

18. The method of claim 15, further comprising the step of loading the selected docking station with a front opening unified pod (FOUP) holding the wafers for processing.

19. A system for processing workpieces on a process station in vacuum, said system comprising,
- a vacuum chamber maintained at high vacuum and containing the process station for processing the workpieces, a first transfer station for holding a first of the workpieces until the process station is in a ready state, a second transfer station for holding a second of the workpieces until the process station is in a ready state, a first vacuum robot for handling the first of the workpieces in the vacuum chamber and a second vacuum robot for handling the second of the workpieces in the vacuum chamber; and
- at least four load locks each having a first portion interfacing with the vacuum chamber for introducing the workpieces into the vacuum chamber for processing on the process station; wherein said first and second vacuum robots each act independently and each transports the workpieces from a load lock to a transfer station to the process station and back to a different load lock and control means for controlling each of the first and second vacuum robots to successively and continuously handle the work pieces introduced from each of the load locks, the first vacuum robot sequencing a first of the wafers from a first of the load locks to the process station via the first transfer station and at completion of processing to a second of the load locks for return to a carrier in atmosphere, the second vacuum robot sequencing a second of the wafers from a third of the load locks to the process station via the second transfer station and at completion of processing to a fourth of the load locks for return to the carrier in atmosphere.

20. The system of claim 19, further comprising a docking station in atmosphere to receive and hold a carrier for the workpieces; and
an atmospheric robot operating in atmospheric pressure to transport the workpieces between the carrier docked in the docking station and each of the plurality of load locks.

21. The system of claim 20, further comprising environmental control means for pumping and venting each of the load locks.

22. The system of claim 21, wherein said control means further controls said environmental control means and one or more valves associated with each of the load locks to pump down and vent each of said load locks in a predetermined sequence.

23. The system of claim 21, wherein the control means controls a sequential movement of the workpiece from the carrier in the docking station at atmospheric pressure to loading of the workpiece into the first of the load locks by the atmospheric robot, receiving of the workpiece into the vacuum chamber by the first vacuum robot, processing of the workpiece on the process station, loading of the workpiece after completion of processing into the second of the load locks by the first vacuum robot, and loading of the workpiece into the carrier from the second of the load locks by the atmospheric robot.

24. The system of claim 21, wherein the carrier comprises a front opening unified pod (FOUP).

25. The system of claim 24, wherein the control means controls the sequential movement of the workpieces including orientation of the workpieces during a time the workpieces are at the first and second transfer stations.

26. The system of claim 21, wherein the carrier comprises a cassette.

27. The system of claim 19, further comprising vacuum control means for maintaining high vacuum in the vacuum chamber containing the process station.

28. The system of claim 19, wherein at least one of the transfer stations comprises means for detecting and correcting an orientation of the workpieces.

29. The system of claim 19, wherein at least one of the transfer stations comprises means for detecting and correcting an alignment of the workpieces.

30. The system of claim 19, wherein the process station comprises an electrostatic chuck for holding the workpiece during processing.

31. The system of claim 19, wherein each of the load locks is sized to hold only a single workpiece.

* * * * *